United States Patent
Engel et al.

(10) Patent No.: US 9,069,088 B2
(45) Date of Patent: Jun. 30, 2015

(54) RADIATION-SENSITIVE DETECTOR DEVICE WITH CHARGE-REJECTING SEGMENT GAPS

(71) Applicant: KONINKLIJKE PHILIPS N.V., Eindhoven (NL)

(72) Inventors: Klaus Juergen Engel, Veldhoven (NL); Christoph Herrmann, Aachen (DE)

(73) Assignee: Koninklijke Philips N.V., Eindhoven (NL)

(*) Notice: Subject to any disclaimer, the term of this patent is extended or adjusted under 35 U.S.C. 154(b) by 0 days.

(21) Appl. No.: 14/354,695

(22) PCT Filed: Nov. 7, 2012

(86) PCT No.: PCT/IB2012/056231
§ 371 (c)(1),
(2) Date: Apr. 28, 2014

(87) PCT Pub. No.: WO2013/068944
PCT Pub. Date: May 16, 2013

(65) Prior Publication Data
US 2014/0284489 A1    Sep. 25, 2014

Related U.S. Application Data

(60) Provisional application No. 61/557,480, filed on Nov. 9, 2011.

(51) Int. Cl.
*G01T 1/29* (2006.01)
*G01T 1/24* (2006.01)
*H01L 27/146* (2006.01)

(52) U.S. Cl.
CPC .............. *G01T 1/2928* (2013.01); *G01T 1/241* (2013.01); *H01L 27/14609* (2013.01); *H01L 27/14665* (2013.01)

(58) Field of Classification Search
CPC .......................... G01T 1/2921; G01T 1/2928
See application file for complete search history.

(56) References Cited

U.S. PATENT DOCUMENTS

| | | |
|---|---|---|
| 5,677,539 A | 10/1997 | Apotovsky et al. |
| 6,175,120 B1 | 1/2001 | McGregor et al. |
| 7,315,025 B2 | 1/2008 | Yokoi et al. |
| 7,453,068 B2 | 11/2008 | Blevis |
| 7,955,992 B2 | 6/2011 | Chen et al. |
| 2005/0258364 A1* | 11/2005 | Whitehouse et al. ......... 250/292 |
| 2007/0075251 A1 | 4/2007 | Doughty et al. |

OTHER PUBLICATIONS

Guni, E., et al.; The Influence of Pixel Pitch and Electrode Pad Size on the Spectroscopic Performance of a Photon Counting Pixel Detector with CdTe Sensor; 2011; IEEE Trans. on Nuclear Science; 58(1)17-25.

* cited by examiner

*Primary Examiner* — David Porta
*Assistant Examiner* — Faye Boosalis

(57) ABSTRACT

In radiation-sensitive detector devices, such as direct conversion detectors, charges are drifting within an externally applied electric field towards collecting electrodes (4), which are segmented (e.g. representing a pixel array). At the gaps between segments, electrical field lines can leave the detector, and charges drifting along those field lines can be trapped within the gap. This can be avoided by external electrodes (8) which push electric field lines back into the direct conversion material.

11 Claims, 2 Drawing Sheets

US 9,069,088 B2

RADIATION-SENSITIVE DETECTOR DEVICE WITH CHARGE-REJECTING SEGMENT GAPS

CROSS REFERENCE TO RELATED APPLICATIONS

This application is a national filing of PCT application Ser. No. PCT/IB2012/856231, filed Nov. 7, 2012, published as WO 2013/068944 A1 on May 16, 2013, which claims the benefit of U.S. provisional application Ser. No. 61/557,480 filed Nov. 9, 2011, which is incorporated herein by reference.

FIELD OF THE INVENTION

The present application generally relates to an imaging system, a method for detecting radiation, and a radiation-sensitive detector devices with segmented electrode patterns for spatial resolution.

BACKGROUND OF THE INVENTION

Medical or other imaging systems may include an array of indirect conversion (scintillator/photosensor) detectors such as a gadolinium oxysulfide (GOS) detectors or direct conversation detectors such as Cadmium Zinc Telluride (CZT) or Cadmium telluride (CdTe) detectors. In a direct conversion detector with a single layer, a common cathode electrode biased at a large negative voltage is located on one side of the detector layer. A pixelated anode biased at ground or close to ground is located on the other side of the layer. Signals from anode pixels are routed through a substrate and/or circuit board to the readout electronics. Cadmium telluride (CdTe) and cadmium zinc telluride (CZT) comprise semiconductor materials with high stopping power, for example, x-ray attenuation, but low mobility and long charge transport time. For example, a single layer direct conversion detector of CZT or CdTe with 1.0 to 5.0 mm thickness typically saturates at about one million to ten million counts per sec per millimeter squared. Silicon (Si) and gallium arsenide (GaAs) comprise semiconductor materials with high mobility and short charge transport time, but low x-ray stopping power, for example, x-ray attenuation.

As an example, a radiation sensitive semiconductor substrate may be partitioned into a plurality of rows of detector elements and a plurality of columns of detector elements to form a two-dimensional array of detector elements. Each detector element is associated with a corresponding electrical contact for transferring the corresponding electrical signal to a readout substrate, which in turn includes electrical contacts for transferring the electrical signal off from the detector. In CZT based detectors, the electrical contacts on the CZT radiation sensitive semiconductor substrate may be gold (Au), platinum (Pt) or Indium (In), depending on the manufacturer of the detector and/or other factors.

The above mentioned energy resolving detectors for X-ray and gamma radiation based on direct conversion materials have been proven as an efficient way to measure photon energies. An incident photon creates a number of electron/hole pairs. Thereafter, electrons and holes typically drift in opposite directions within the electric field supplied by the electrodes. During the drift process, a current is capacitively induced on each electrode attached to the detector system according to the Shockley-Ramo theorem.

Typically, the electrodes are segmented in a pattern of stripes or pixels to provide a spatial resolution of the interaction events which created the electron/hole clouds. As described e.g. in the U.S. Pat. No. 5,677,539, another reason for electrode segmentation is an improved detection of only one sort of charge carriers, as a smaller electrode segment has a relatively low area such that relevant current pulses are only induced if the charges drift within close vicinity to the electrode segment. However, electric field lines can leave the detector crystal at gaps between electrode segments. Charges (e.g. electrons) following the electric field lines can thus be trapped at the surface for a relatively long time, therefore they are no longer contributing to the pulse signal to be measured. One solution of this problem is the implementation of steering electrodes as suggested in the above U.S. Pat. No. 5,677,539, where the steering electrodes are placed within the gap between detector segments and charged such that the electric field lines are always guided towards the collecting (i.e. signal generating) electrodes. However, the implementation of this technology is in some cases not possible (as additional miniaturization or structuring of is required), or the voltage required to drive the steering electrode induces bias currents which negatively affects the noise properties.

SUMMARY OF THE INVENTION

It is an object of the invention to provide a detector device and a method of detecting radiation, by means of which an improved imaging performance can be achieved.

This object is achieved by a detector emitting device as claimed in claim 1, a manufacturing method as claimed in claim 9 and an imaging system as claimed in claim 11.

Accordingly, remote guiding electrodes are provided and charged such that electric field lines which would commonly leave the detector crystal at the gap portions are pushed back to the detector crystal such that they end on the inner side of a collecting electrode. Trapping of charges can thereby be prevented, so that more charges contribute to the output signal.

According to a first aspect, the plurality of guiding electrodes may be placed on a connecting layer provided for connecting the charge collecting electrodes. This provides the advantage that the guiding electrodes can be placed on an existing layer, so that they can be added by simply modifying the masking process. However, it is noted that the guiding electrodes can be placed at any other remote position, e.g. at another intermediate layer or within a layer different from the conversion layer or in an electric circuit, where they can fulfill their function of pushing back electrical field lines into the conversion layer.

According to a second aspect which may be combined with the first aspect, the charge collecting electrodes are anodes for electron collection or cathodes for hole collection. Thus, the proposed solution can be implemented for conversion layers with both charge carrier types.

According to a third aspect which can be combined with any one of the first and second aspects, the pattern of the charge collecting electrodes defines a pixel array for converting the radiation into an image. The improved detector can thus be used as a detector for a radiation-based imaging system.

According to a fourth aspect which can be combined with any one of the first to third aspects, at least one counter electrode may be provided which is arranged at a second surface of the conversion layer, the second surface opposing the first surface. In this case, a counter electrodes may also form a predetermined pattern with intermediate gaps, wherein further ones of the external guiding electrodes may be arranged to prevent electric field lines from leaving the conversion layer through the gaps of the predetermined pattern of the counter electrodes. Thereby, the same advantage can be achieved for gap structures at the opposite side or surface of the conversion layer.

According to a fifth aspect which can be combined with any one of the first to fourth aspects, a space provided between the conversion layer and the connecting layer may be at least partially filled with a glue. This improves mechanical stability of the device. In a more specific example, the glue may be placed only locally between the gaps and the guiding electrodes, e.g., so that the glue does not touch the charge collecting electrodes. Thereby, the guiding function is improved and bias currents are improved.

According to a sixth aspect which can be combined with any one of the first to fifth aspects, a voltage close to $U_g = U_{bias} \cdot (d_{gap}/2 + d_g \cdot \epsilon_c/\epsilon_g)/(d_{gap}/2 + d_c)$ is applied to the guiding electrodes, wherein $U_{bias}$ denotes a voltage applied between the charge collecting electrodes and a counter electrode through which the radiation is received, $d_{gap}$ denotes the width of a gap between neighboring collecting electrodes, $d_g$ denotes a distance between the connecting layer, on which the guiding electrodes are arranged, and the conversion layer, $\epsilon_c$ denotes the relative permittivity of the conversion layer material, $\epsilon_g$ denotes the relative permittivity of the volume between conversion layer and connecting layer, and $d_c$ denotes the thickness of the conversion layer. This provides the advantage that the voltage applied to the guiding electrodes can be optimized for a given detector geometry. Further advantageous embodiments are defined below.

BRIEF DESCRIPTION OF THE DRAWINGS

These and other aspects of the invention will be apparent from and elucidated with reference to the embodiments described hereinafter.

In the drawings.

DETAILED DESCRIPTION OF EMBODIMENTS

Various embodiments are now described based on a radiation sensitive direct conversion detector. It is however noted that the present invention can be applied to any type of detector of an imaging system, in which electron/hole pairs are generated and collected by an electric field.

Exemplary diagnostics devices comprise x-ray systems, single-photon emission computed tomography systems (SPCT), ultrasound systems, computed tomography (CT) systems, positron emission tomography (PET) systems, and other types of imaging systems. Exemplary applications of x-ray sources comprise imaging, medical, security, and industrial inspection applications. However, it will be appreciated by those skilled in the art that an exemplary implementation is applicable for use with single-slice or other multi-slice configurations. Moreover, an exemplary implementation is employable for the detection and conversion of x-rays. However, one skilled in the art will further appreciate that an exemplary implementation is employable for the detection and conversion of other high frequency electromagnetic energy and/or high frequency polychromatic electromagnetic energy, and/or other kind of ionizing radiation like for example alpha or beta particles.

Figure 1:
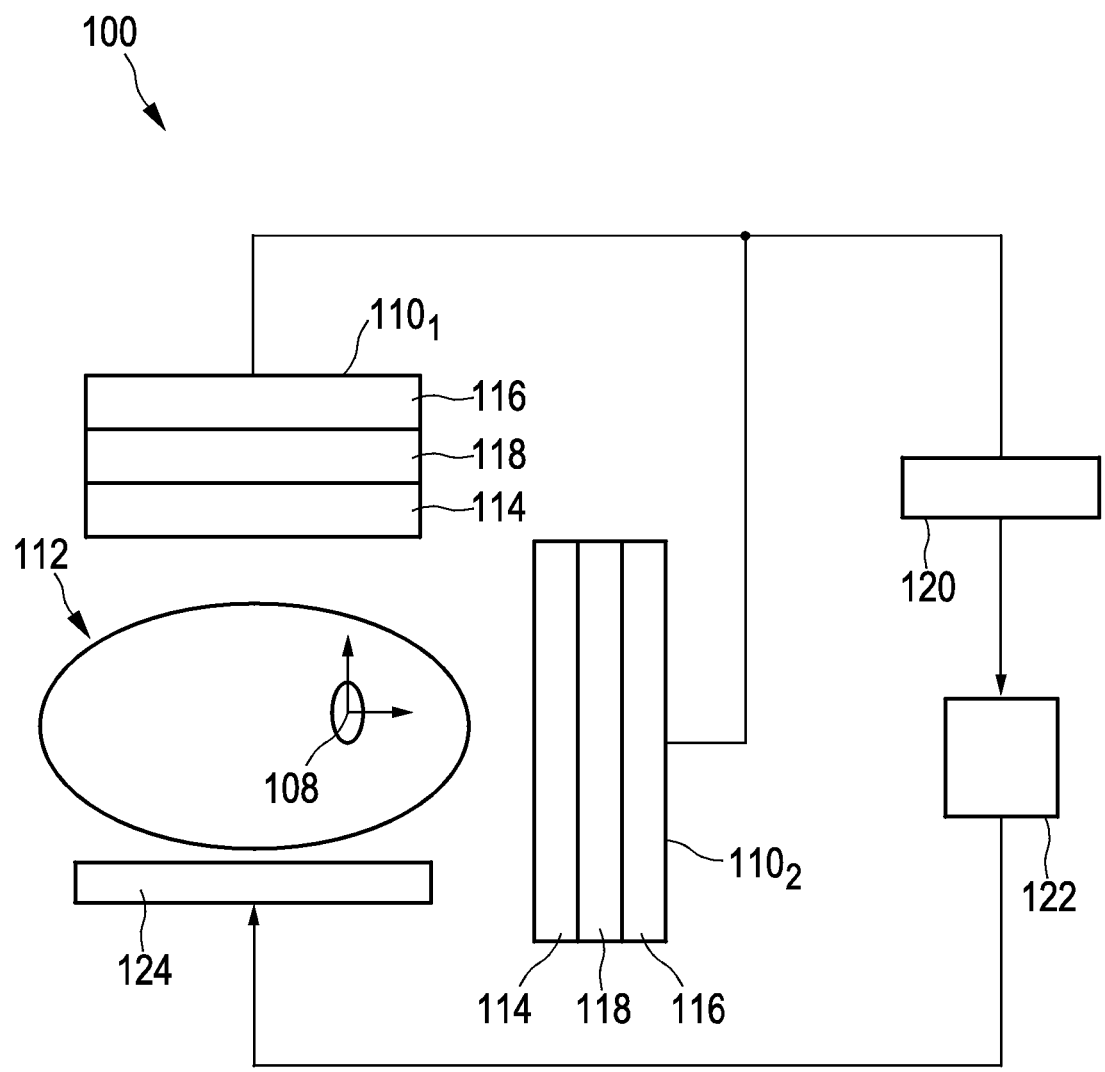
FIG. 1 shows a schematic block diagram of medical imaging system in which the present invention can be implemented.

FIG. 1 shows a schematic imaging system, e.g. a single photon emission computer tomography (SPECT) system, 100 includes at least one radiation sensitive detector array 110. As depicted, the illustrated system 100 includes two radiation sensitive detector arrays $110_1$ and $110_2$. The radiation sensitive detector arrays $110_1$ and $110_2$ are disposed relative to each other at an angle in the range of roughly 90 to 102 degrees. Other numbers of detector arrays 110 and angles therebetween are contemplated. The radiation sensitive detector arrays $110_1$ and $110_2$ rotate about an examination region 112 and acquire projections for plurality of projection angles or views.

In the illustrated example, the radiation sensitive detector arrays $110_1$ and $110_2$ are two-dimensional direct conversion detector arrays that include various layers. Such layers may include a radiation sensitive layer 114, a read out layer 116, and an intermediate layer 118. The intermediate layer 118 electrically and physically couples the radiation sensitive layer 114 and the read out layer 116. The radiation sensitive layer 114 may include a CZT substrate with at least one electrical contact formed from a material that adheres well to CZT. In addition, the intermediate layer 118 may include a material that is well suited to form an electrical interconnect with the electrical contact on the CZT substrate.

In general, the radiation sensitive layer 114 receives gamma radiation from radionuclide decay 108 occurring in the examination region 112 and generates a signal indicative thereof. The signal is conveyed through the intermediate layer 118 to the read out layer 116. The signal is output from the detectors 110 via the read out layer 116. A reconstructor 120 reconstructs the projections to generate volumetric image data representative of the detected gamma radiation. The volumetric image data is indicative of the examination region 112. Furthermore, a computer serves as an operator console 122. The console 122 includes a human readable output device such as a monitor or display and an input device such as a keyboard and mouse. Software resident on the console allows the operator to control and interact with the imaging system 100, for example, through a graphical user interface (GUI).

An object support 124, such as a couch, supports a patient or other object in the examination region 112. The object support 124 is movable so as to guide the object within respect to the examination region 112 while performing a scanning procedure. This may include longitudinally moving the object support 124 in coordination with operation of the gamma radiation sensitive detectors 110 so that an object can be scanned at a plurality of longitudinal locations according to desired scanning trajectories.

According to the present embodiments, a direct converter is provided, for which an implementation of steering electrodes is not possible or not desired for some reasons, and which suffer from gaps between collecting electrodes. It is suggested to place an additional electrode not on the direct converter crystal, but externally on a connecting element (e.g. an interposer or an electronic circuit to which the direct converter is bonded). The electrode is charged such that electric field lines which would commonly leave the detector crystal are pushed back to the detector crystal such that they end on the inner side of a collecting electrode.

Figure 2:
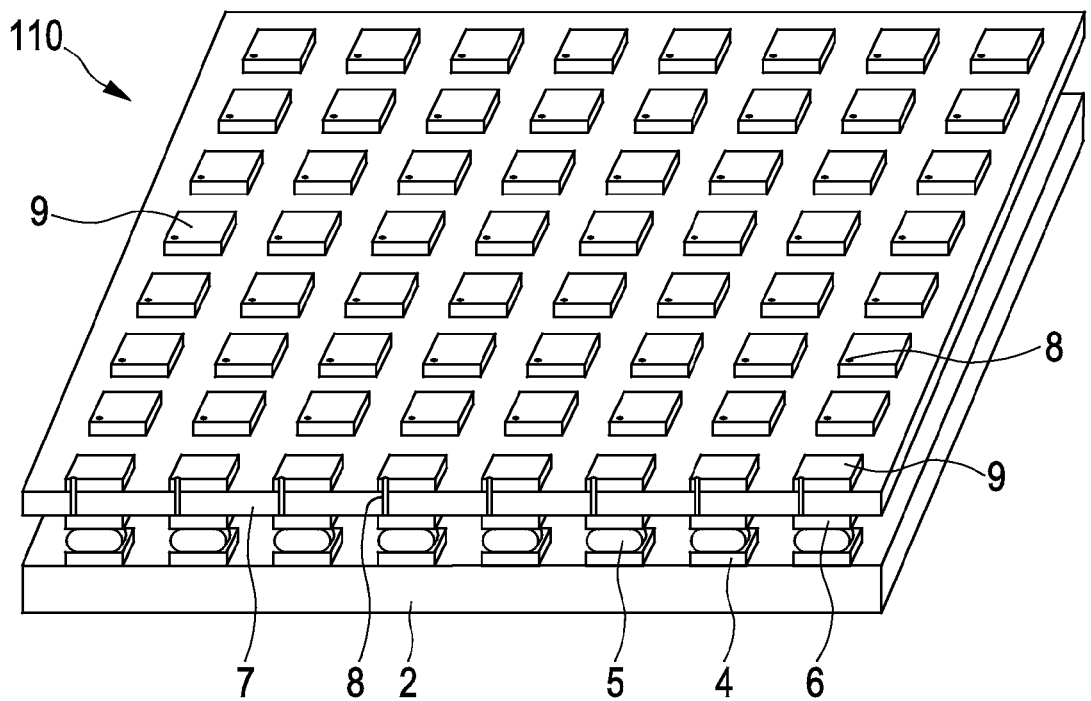
FIG. 2 shows a schematic perspective view of a radiation sensitive detector array in which the present invention can be implemented.

FIG. 2 shows a sub-portion of a non-limiting detector array of the detector 110 shown in FIG. 1. The sub-portion comprises a CZT radiation sensitive detection or conversion substrate or layer 2, charge collecting electrodes 4, solder interconnects or balls 5, a readout substrate or connecting layer 7, first electrical contacts or electrodes 6, and via's 8. The via's 8 extend from each of the first electrodes 6, through the connecting layer 7 to a corresponding one of a plurality of second electrical contacts or electrodes 9, thereby providing an electrical path between the first and second electrical contacts 6 and 9. The electrical signal produced by the charge collecting electrodes 4 of the radiation conversion layer 2 can be transferred from the detector array of the detector 110 through the first and second electrodes 6 and 9. In this example, the detector array includes a plurality of rows and a plurality of columns of detector elements or segments to form a two-dimensional detector array of the detector 110, e.g. which corresponds to a pixel array of a detected image. It is to be appreciated that the detectors 110 may be tiled with one or more other detector arrays to increase the detection surface of the detector 110.

Figure 3:
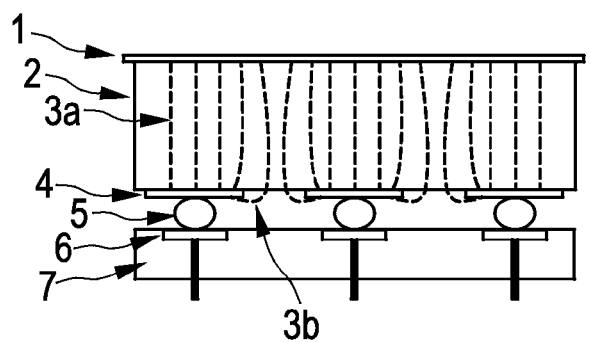
FIG. 3 shows a cross-sectional view of a conventional detector design suffering from the trapping problem.

FIG. 3 shows a cross-sectional view of a common or conventional design of the detector array suffering from electric field lines leaving the detector through gaps between collecting electrode segments. It is noted that in FIG. 3 the detector stack of FIG. 2 is flipped so that the conversion layer 2 is shown on the upper side with an additional continuous counter electrode 1 placed on top of the conversion layer 2, through which the radiation is incident from the examination region 112 of FIG. 1. The conversion layer 2 may be made of a direct conversion crystal, such as CZT. The solder balls 5 are provided to connect each of the charge collecting electrodes 4 with a corresponding one of the first electrodes 6, wherein the first electrodes 6 acts as contact pads for the solder balls 5 on the connection layer 7, which may be, e.g., an interposer or an electronic circuit. The remaining components of FIG. 2 are not shown in FIG. 3 for reasons of brevitiy and simplicity.

A voltage is applied between the counter electrode 1 and the charge collecting electrodes 4, so that—as shown in FIG. 3—most of the electric field lines 3a between the upper continuous electrode 1 and the charge collecting electrodes 4 end "inside" the conversion layer 2 on one of the charge collecting electrodes 4. However, in the region of the gaps between the charge collecting electrodes 4, some electric field lines 3b leave the conversion layer 2 and end either "outside" the conversion layer 2 on one of the charge collecting electrodes 4 or somewhere else.

Figure 4:
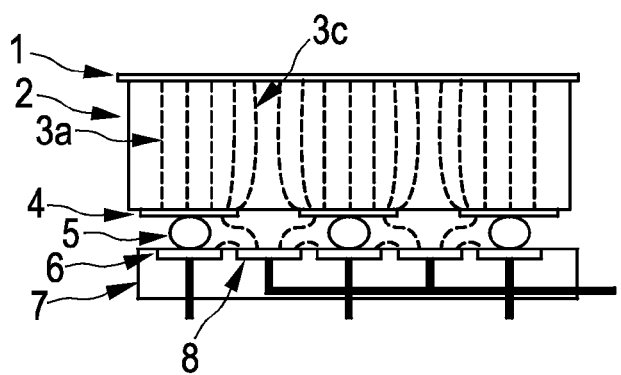
FIG. 4 shows a cross-sectional view of an improved detector design according to an embodiment.

FIG. 4 shows a cross-sectional view of an improved detector design according to an embodiment. The design of the proposed detector is adapted to prevent electric field lines from leaving the detector, since they are "pushed back" to the conversion layer 2. To achieve this, additional guiding electrodes 8 are provided, which push the electric field lines 3b of FIG. 3 to act like the electrical field lines 3c shown in FIG. 4 and no longer leave the conversion layer 2.

According to a first embodiment, the additional guiding electrodes 8 are placed not on the detector crystal but on the connection layer 7, which usually is used to connect the charge collecting electrodes 4. The guiding electrodes 8 are charged by an electric potential which has the same sign as the charges which are intended to be collected by the charge collecting electrodes 4. In a typical detector in which the signal of electrons is measured, the guiding electrodes 8 would be charged negatively to repulse electrons. Dependent on the voltage of the guiding electrodes 8, the electric field lines 3b which in absence of the guiding electrodes 8 would leave the conversion layer 2, are "repulsed" by the electric potential such that ideally no electrical field line is leaving the conversion layer 2 through the gaps between the charge collecting electrodes 4. As a result, electrons or holes which in case of FIG. 3 would follow a field line 3b and get trapped at the gap, can now follow any field line in FIG. 4 such that they are collected by the charge collecting electrodes 4 independent on where they were generated inside the volume of the conversion layer 2.

Depending on the voltage applied between the counter electrode 1 and the charge collecting electrodes 4, the charge collecting electrodes 4 can act as anodes (for electron collection) or as cathodes (for hole collection).

Furthermore, the segmentation of the charge collecting electrodes 4 needs not to be a pixel array. Arbitrary shapes and patterns are possible, like for example stripes.

In a second embodiment, the continuous electrode 1 could also be segmented like the charge collecting electrodes 4. Then, similar guiding electrodes 8 can be provided at the opposite side of the conversion layer 2 as as to keep the electrical field lines in the conversion layer 2.

As another option, the space between the conversion layer 2 and the connecting layer 7 could be filled with air but more preferred with any kind of glue to get a more mechanically stable device. The glue should be selected with a relatively low conductivity and should be placed only locally between the gaps and the guiding electrodes 8. In an example, the glue should be placed so as not to touch the collecting electrodes 4 and thus provide an optimal "guiding" of electric field lines and minimize possible bias currents between the charge collecting electrodes 4 and the guiding electrodes 8. Additionally, the connecting layer 7 could be configured to provide sufficient resistance to avoid a significant bias current between the first electrodes 6 and the guiding electrodes 8.

Moreover, the pushing or repelling voltage applied to the guiding electrodes 8 may be selected to depend on the geometry, i.e. at least one of the gap size between the charge collecting electrodes 4 (e.g. pixel gap size), the distance between conversion layer 2 and the connecting layer 7, the thickness of conversion layer 2, the relative permittivity of the used materials, and the voltage of the counter electrode 1.

According to a third embodiment, where detector material of the conversion layer 2 and the filling glue between the conversion layer 2 and the connecting layer 7 have comparable relative permittivities and the gap width as well as the distance between the conversion layer 2 and the connecting layer 7 is small compared to the thickness of the conversion layer 2, the voltage $U_g$ applied to the guiding electrodes 8 can be set approximately according to the following equation:

$$U_g = U_{bias} \cdot (d_{gap}/2 + d_g \cdot \epsilon_c/\epsilon_g)/(d_{gap}/2 + d_c)$$

where $U_{bias}$ denotes the bias voltage applied between the counter electrode(s) 1 and the charge collecting electrodes 4, $d_{gap}$ denotes the width of a gap between neighboring collecting electrodes 4, $d_g$ denotes the distance between the conversion layer 2 and the connecting layer 7, $\epsilon_c$ denotes the relative permittivity of the conversion layer material, $\epsilon_g$ denotes the relative permittivity of the volume between conversion layer 2 and connecting layer 7, and $d_c$ denotes the thickness of the conversion layer 2. In a practical example, typical values could be $U_{bias}$=900V, $d_{gap}$=100 μm, $d_g$=30 gm, $\epsilon_c$=10, $\epsilon_g$=4, and $d_c$=3 mm, which would result in a guiding electrode voltage $U_g$=37V.

To summarize, a radiation-sensitive detector device, such as a direct conversion detector, and a method of detecting radiation have been described, wherein charges are drifting within an externally applied electric field towards collecting electrodes, which are segmented (e.g. representing a pixel array). At the gaps between segments, electrical field lines can leave the detector, and charges drifting along those field lines can be trapped within the gap. This is avoided by adding external or remote guiding electrodes which push electric field lines back into the direct conversion material.

While the invention has been illustrated and described in detail in the drawings and foregoing description, such illustration and description are to be considered illustrative or exemplary and not restrictive. The invention is not limited to the disclosed embodiment and applies to all sort of detectors, in which electron/hole pairs are generated and collected by an electric field. The guiding electrodes may be of any shape and may be provided at various locations remote from the conversion layer to provide the pushing function against electrical field lines which would otherwise leave the conversion layer. They may be provided in an intermediate layer or within or on the other side of the connecting layer or on an electric circuit of the detector.

Furthermore, other variations to the disclosed embodiment can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope.

The invention claimed is:

1. A detector device for detecting radiation, comprising:
   a. a conversion layer for converting incident radiation into an electric charge;
   b. a plurality of charge collecting electrodes arranged at a first surface of said conversion layer and adapted to collect electric charge generated in said conversion layer, said charge collecting electrodes forming a predetermined pattern with intermediate gaps; and
   c. a plurality of external guiding electrodes placed remote from said conversion layer and connected to an electric potential which has the same sign as the charge to he collected by said charge collecting eiectrodes, said external guiding electrodes being arranged to prevent electric field lines from leaving said conversion layer through said gaps; wherein said detector device is adapted to apply to said guiding electrodes (8) a voltage $U_g = U_{bias} \cdot (d_{gap}/2 + d_g \cdot \epsilon_c/\epsilon_g)/(d_g/2 + d_c)$, wherein $U_{bias}$ denotes a voltage applied between said charge collecting electrodes (4) and a counter electrode (1) through which said radiation is received, $d_{gap}$ denotes the width of said gaps between said charge collecting electrodes (4), $d_g$ denotes a distance between a connecting layer (7) on which said guiding electrodes (8) are arranged and said conversion layer (2), $\epsilon_g$ denotes the relative permittivity of said conversion layer (2), $\epsilon_g$ denotes the relative permittivity in the layer between said collecting electrodes (4) and said guiding electrodes (8), and $d_g$ denotes the thickness of said conversion layer (2).

2. The device according to claim 1, wherein said plurality of guiding electrodes are placed on a connecting layer provided for connecting said charge collecting electrodes.

3. The device according to claim 2, wherein a space provided between said conversion layer and said connecting layer is at least partially filled with glue.

4. The device according to claim 3, wherein said glue is placed only locally between said gaps and said guiding electrodes.

5. The device according to claim 4, wherein said glue is arranged so that it does not touch said charge collecting electrodes.

6. The device according to claim 1, wherein said charge collecting electrodes are anodes for electron collection or cathodes for hole collection.

7. The device according to claim 1, wherein the pattern of said charge collecting electrodes defines a pixel array for converting said radiation into an image.

8. The device according to claim 1, further comprising at least one counter electrode which is arranged at a second surface of said conversion layer said second surface opposing said first surface.

9. The device according to claim 8, wherein said counter electrodes form a predetermined pattern with intermediate gaps, and wherein further ones of said external guiding electrodes are arranged to prevent electric field lines from leaving said conversion layer through said gaps of said predetermined pattern of said counter electrodes.

10. An imaging system comprising a detector device according to claim 1 for detecting radiation.

11. A method of detecting radiation, said method comprising:
   a. converting incident radiation into an electric charge by using a conversion layer;
   b. collecting electric charge generated in said conversion layer by using a pattern of electrodes with intermediate gaps; and
   c. connecting a plurality of external guiding electrodes to an electric potential which has the same sign as the charge to be collected by said charge collecting electrodes, said external guiding electrodes being placed remote from said conversion layer in a manner to prevent electric field lines from leaving said conversion layer through said gaps, wherein applying to said guiding electrodes a voltage $U_g = U_{bias} \cdot (d_{gap}/2 + d_g \cdot \epsilon_c/\epsilon_g)/(d_g/2 + d_c)$, wherein $U_{bias}$ denotes a voltage applied between said charge collecting electrodes and a counter electrode through which said charge collecting electrodes, $d_{gap}$ denotes the width of said gaps between said charge collecting electrodes, $d_g$ denotes a distance between a connecting layer on which said guiding electrodes are arranged and said conversion layer, $\epsilon_g$ denotes the relative permittivity of said conversion layer, $\epsilon_g$ denotes the relative permittivity in the layer between said collecting electrodes and said guiding electrodes, and $d_c$ denotes the thickness of said conversion layer.

* * * * *